(12) United States Patent
Sreenivasan

(10) Patent No.: US 7,858,528 B2
(45) Date of Patent: Dec. 28, 2010

(54) POSITIVE TONE BI-LAYER METHOD

(75) Inventor: Sidlgata V. Sreenivasan, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 0 days.

(21) Appl. No.: 12/689,773

(22) Filed: Jan. 19, 2010

(65) Prior Publication Data

US 2010/0140218 A1    Jun. 10, 2010

Related U.S. Application Data

(63) Continuation of application No. 11/844,824, filed on Aug. 24, 2007, now Pat. No. 7,670,953, which is a continuation of application No. 11/611,287, filed on Dec. 15, 2006, now Pat. No. 7,323,417, which is a continuation of application No. 10/946,570, filed on Sep. 21, 2004, now Pat. No. 7,186,656, which is a continuation-in-part of application No. 10/850,876, filed on May 21, 2004, now abandoned, said application No. 11/844,824 is a continuation of application No. 10/560,928, filed on Nov. 17, 2006, now Pat. No. 7,261,831, which is a continuation of application No. 10/396,615, filed on Mar. 25, 2003, now Pat. No. 7,179,396.

(51) Int. Cl.
*H01L 21/311* (2006.01)
*C03C 17/30* (2006.01)

(52) U.S. Cl. .......................... 438/700; 216/44

(58) Field of Classification Search ................ 438/700, 438/735, 739, 745; 216/44, 52; 264/220, 264/425; 257/E21.215–E21.316
See application file for complete search history.

(56) References Cited

U.S. PATENT DOCUMENTS

| | | | |
|---|---|---|---|
| 7,179,396 B2 * | 2/2007 | Sreenivasan | 216/44 |
| 7,261,831 B2 * | 8/2007 | Sreenivasan | 216/44 |
| 7,670,953 B2 * | 3/2010 | Sreenivasan | 438/700 |

* cited by examiner

*Primary Examiner*—Calvin Lee
(74) *Attorney, Agent, or Firm*—Laura C. Robinson

(57) ABSTRACT

Methods of patterning a substrate including creating a multi-layered structure by forming, on the substrate, a patterned layer having protrusions and recessions are described. A polymerizable material composition is dispense on the patterned layer defining a conformal layer, with the multi-layered structure having a crown surface facing away from the substrate. Portions of the multi-layered structure are removed to expose regions of the substrate in superimposition with the protrusions, while forming a hard mask in areas of the crown surface in superimposition with the recessions.

16 Claims, 5 Drawing Sheets

POSITIVE TONE BI-LAYER METHOD

CROSS-REFERENCE TO RELATED PATENT APPLICATION

This application is a continuation of U.S. application Ser. No. 11/844,824 filed Aug. 24, 2007, now U.S. Pat. No. 7,670,953. U.S. application Ser. No. 11/844,824 is a continuation of U.S. application Ser. No. 11/611,287 filed Dec. 15, 2006 (now U.S. Pat. No. 7,323,417), which is a continuation of U.S. application Ser. No. 10/946,570 filed Sep. 21, 2004 (now U.S. Pat. No. 7,186,656). U.S. application Ser. No. 10/946,570 is a continuation-in-part of U.S. application Ser. No. 10/850,876 filed on May 21, 2004 (abandoned). U.S. application Ser. No. 11/844,824 is also a continuation of application Ser. No. 11/560,928 filed Nov. 17, 2006 (now U.S. Pat. No. 7,261,831), which is a continuation of U.S. application Ser. No. 10/396,615 filed Mar. 25, 2003 (now U.S. Pat. No. 7,179,396). All of the aforementioned applications and patents are incorporated herein by reference in their entirety.

BACKGROUND OF THE INVENTION

The field of invention relates generally to micro-fabrication of structures. More particularly, the present invention is directed to patterning substrates in furtherance of the formation of structures.

Micro-fabrication involves the fabrication of very small structures, e.g., having features on the order of micro-meters or smaller. One area in which micro-fabrication has had a sizeable impact is in the processing of integrated circuits. As the semiconductor processing industry continues to strive for larger production yields while increasing the circuits per unit area formed on a substrate, micro-fabrication becomes increasingly important. Micro-fabrication provides greater process control while allowing increased reduction of the minimum feature dimension of the structures formed. Other areas of development in which micro-fabrication has been employed include biotechnology, optical technology, mechanical systems and the like.

An exemplary micro-fabrication technique is shown in U.S. Pat. No. 6,334,960 to Willson et al. Willson et al. disclose a method of forming a relief image in a structure. The method includes providing a substrate having a transfer layer. The transfer layer is covered with a polymerizable fluid composition. An imprint device makes mechanical contact with the polymerizable fluid. The imprint device includes a relief structure formed from lands and grooves. The polymerizable fluid composition fills the relief structure, with the thickness of the polymerizable fluid in superimposition with the lands defining a residual thickness. The polymerizable fluid composition is then subjected to conditions to solidify and polymerize the same, forming a solidified polymeric material on the transfer layer that contains a relief structure complimentary to that of the imprint device. The imprint device is then separated from the solid polymeric material such that a replica of the relief structure in the imprint device is formed in the solidified polymeric material. The transfer layer and the solidified polymeric material are subjected to an environment to selectively etch the transfer layer relative to the solidified polymeric material such that a relief image is formed in the transfer layer. Thereafter, conventional etching processes may be employed to transfer the pattern of the relief structure into the substrate.

It is desired to minimize dimensional variations between the pattern recorded in the polymeric material from the pattern transferred into the substrate, referred to as transfer distortions. To that end, many attempts have been made to advance the micro-fabrication technique of Willson et al. For example, it has been desired to minimize the residual thickness of the solidified polymeric material. The thinner the residual thickness, the greater reduction in transfer distortions. The residual thickness of the solidified polymeric material is proportional to the residual thickness of the polymerizable fluid. However, the rate at which the polymerizable fluid fills the relief structure is inversely proportional to the cube of the residual thickness of polymerizable fluid. It is manifest that minimizing the transfer distortions increases the time required to record the pattern in the substrate. Thus, a tradeoff exists between throughput and minimization of transfer distortions.

DETAILED DESCRIPTION OF THE INVENTION

Figure 1:
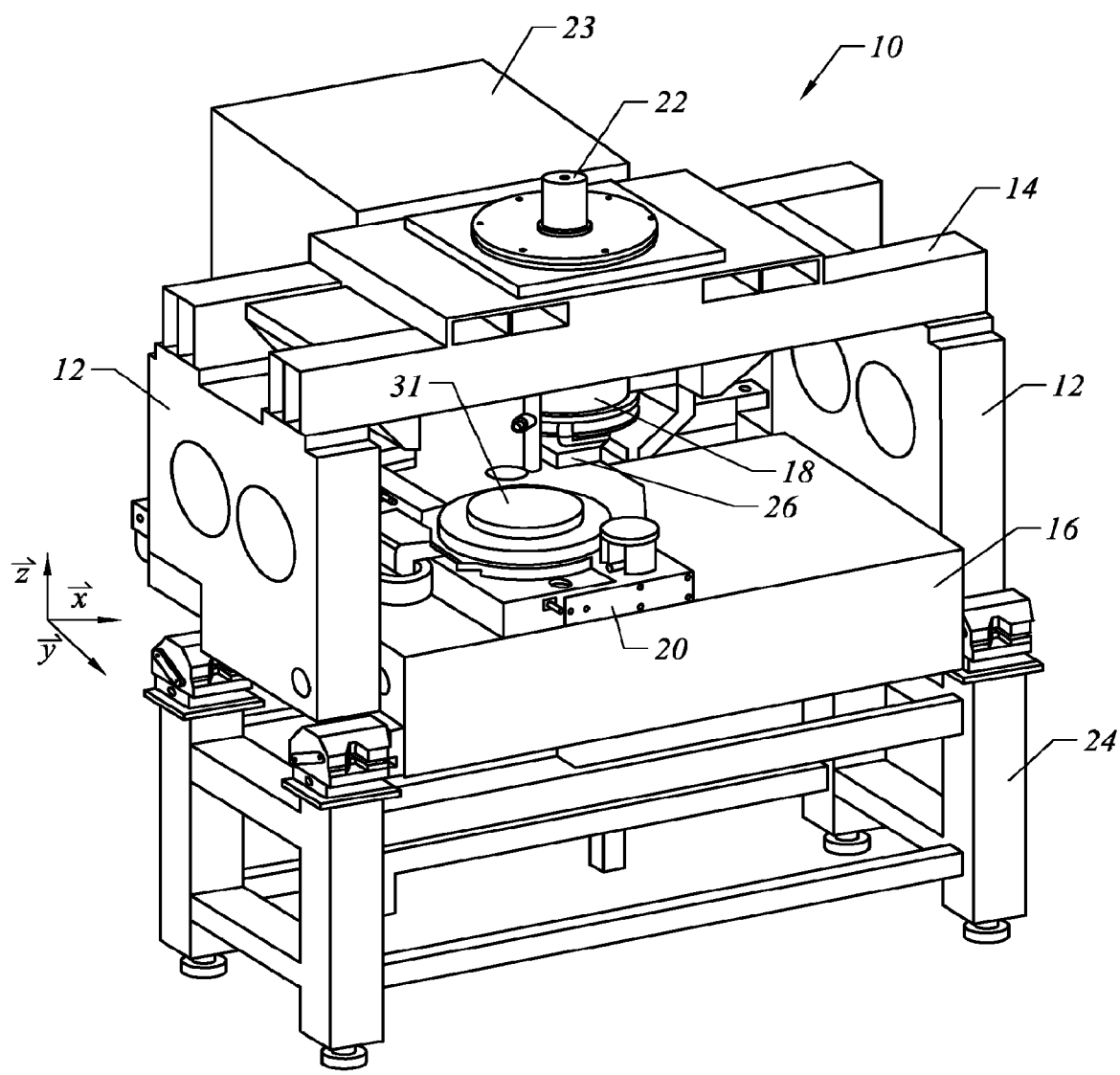
FIG. 1 is a perspective view of a lithographic system in accordance with the present invention.

FIG. 1 depicts a lithographic system 10 in accordance with one embodiment of the present invention that includes a pair of spaced-apart bridge supports 12 having a bridge 14 and a stage support 16 extending therebetween. Bridge 14 and stage support 16 are spaced-apart. Coupled to bridge 14 is an imprint head 18, which extends from bridge 14 toward stage support 16. Disposed upon stage support 16 to face imprint head 18 is a motion stage 20. Motion stage 20 is configured to move with respect to stage support 16 along X and Y axes. A radiation source 22 is coupled to system 10 to impinge actinic radiation upon motion stage 20. As shown, radiation source 22 is coupled to bridge 14 and includes a power generator 23 connected to radiation source 22.

Figure 2:
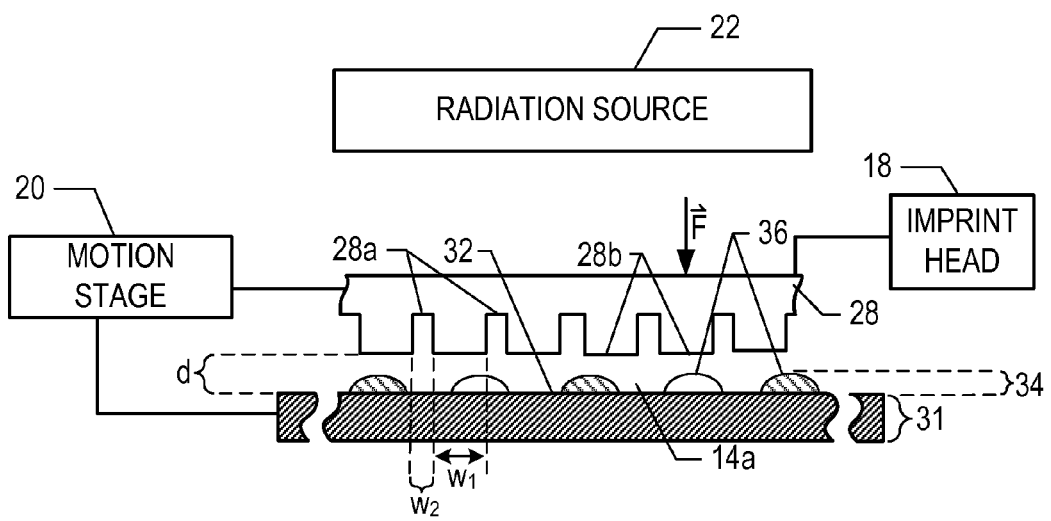
FIG. 2 is a simplified elevation view of a lithographic system, shown in FIG. 1, employed to create a patterned imprinting layer in accordance with the present invention.

Referring to both FIGS. 1 and 2, connected to imprint head 18 is a substrate 26 having a patterned mold 28 thereon. Patterned mold 28 includes a plurality of features defined by a plurality of spaced-apart recesses 28a and projections 28b. Projections 28b have a width $W_1$, and recesses 28a have a width $W_2$, both of which are measured in a direction that extends transversely to Z axis. The plurality of features defines an original pattern that is to be transferred into a wafer 31 positioned on motion stage 20. To that end, imprint head 18 is adapted to move along the Z axis and vary a distance "d" between patterned mold 28 and wafer 31. Alternatively, or in conjunction with imprint head 18, motion stage 20 may move substrate 26 along the Z-axis. In this manner, the features on patterned mold 28 may be imprinted into a flowable region of wafer 31, discussed more fully below. Radiation source 22 is located so that patterned mold 28 is positioned between radiation source 22 and wafer 31. As a result, patterned mold 28 is fabricated from material that allows it to be substantially transparent to the radiation produced by radiation source 22.

Figure 3:
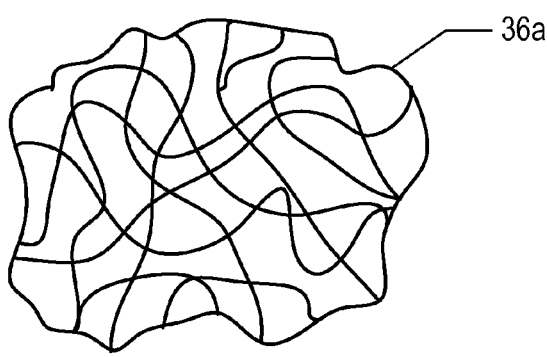
FIG. 3 is a simplified representation of material from which a patterned imprinting layer, shown in FIG. 2, is comprised before being polymerized and cross-linked in accordance with the present invention.

Referring to both FIGS. 2 and 3, a flowable region, such as a patterned imprinting layer 34, is disposed on a portion of surface 32 that presents a substantially planar profile. Flowable region may be formed using any known technique such as a hot embossing process disclosed in U.S. Pat. No. 5,772,905, which is incorporated by reference in its entirety herein, or a laser assisted direct imprinting (LADI) process of the type described by Chou et al. in *Ultrafast and Direct Imprint of Nanostructures in Silicon,* Nature, Col. 417, pp. 835-837, June 2002. In the present embodiment, however, flowable region consists of patterned imprinting layer 34 being deposited as a plurality of spaced-apart discrete beads 36 of material 36a on wafer 31, discussed more fully below. Patterned imprinting layer 34 is formed from a substantially silicon-free material 36a that may be selectively polymerized and cross-linked to record the original pattern therein, defining a recorded pattern. Material 36a is shown in FIG. 4 as being cross-linked at points 36b, forming cross-linked polymer material 36c.

Figure 5:
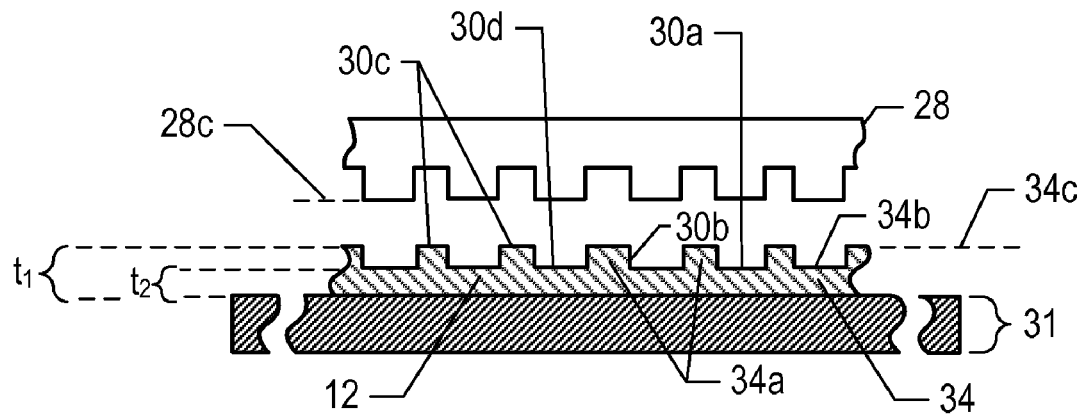
FIG. 5 is a simplified elevation view of an imprint device spaced-apart from the patterned imprinting layer, shown in FIG. 1, after patterning in accordance with the present invention.

Referring to FIGS. 2, 3 and 5, the pattern recorded in patterned imprinting layer 34 is produced, in part, by mechanical contact with patterned mold 28. To that end, imprint head 18 reduces the distance "d" to allow patterned imprinting layer 34 to come into mechanical contact with patterned mold 28, spreading beads 36 so as to form patterned imprinting layer 34 with a contiguous formation of material 36a over surface 32. In one embodiment, distance "d" is reduced to allow sub-portions 34a of patterned imprinting layer 34 to ingress into and fill recesses 28a.

To facilitate filling of recesses 28a, material 36a is provided with the requisite properties to completely fill recesses 28a while covering surface 32 with a contiguous formation of material 36a. In the present embodiment, sub-portions 34b of patterned imprinting layer 34 in superimposition with projections 28b remain after the desired, usually minimum distance "d", has been reached, leaving sub-portions 34a with a thickness, $t_1$ and sub-portions 34b with a thickness, $t_2$. Thickness $t_2$ is referred to as a residual thickness. Thicknesses "$t_1$" and "$t_2$" may be any thickness desired, dependent upon the application.

Figure 4:
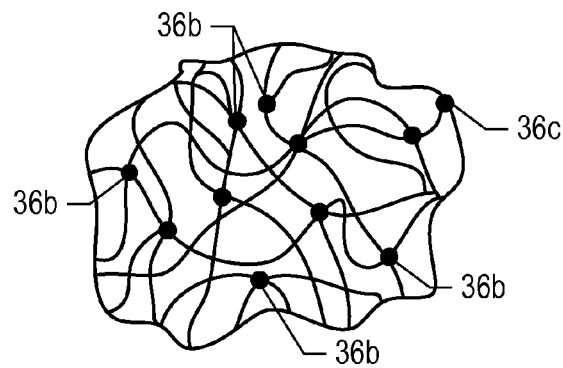
FIG. 4 is a simplified representation of cross-linked polymer material into which the material shown in FIG. 3 is transformed after being subjected to radiation in accordance with the present invention.

Referring to FIGS. 2, 3 and 4, after a desired distance "d" has been reached, radiation source 22 produces actinic radiation that polymerizes and cross-links material 36a, forming cross-linked polymer material 36c. As a result, the composition of patterned imprinting layer 34 transforms from material 36a to material 36c, which is a solid. Specifically, material 36c is solidified to provide side 34c of patterned imprinting layer 34 with a shape conforming to a shape of a surface 28c of patterned mold 28, shown more clearly in FIG. 5, with patterned imprinting layer 34 having recessions 30a and protrusions 30b. After patterned imprinting layer 34 is transformed to consist of material 36c, shown in FIG. 4, imprint head 18, shown in FIG. 2, is moved to increase distance "d" so that patterned mold 28 and patterned imprinting layer 34 are spaced-apart.

In a further embodiment, recessions 30a and protrusions 30b of imprinting layer 34 may be formed by such techniques including, but not limited to, photolithography (various wavelengths including G line, I line, 248 nm, 193 nm, 157 nm, and 13.2-13.4 nm), e-beam lithography, x-ray lithography, ion-beam lithography, and atomic beam lithography.

Figure 6:
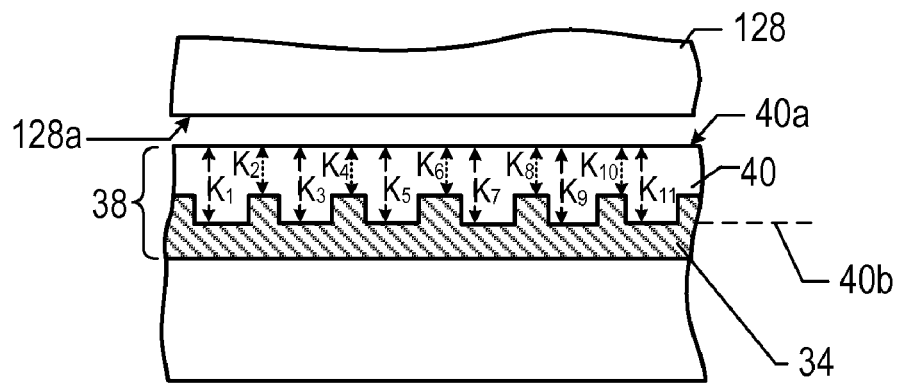
FIG. 6 is a simplified elevation view of a lithographic system, shown in FIG. 1, after formation of a multi-layered structure by deposition of a conformal layer, adjacent to the patterned imprinting layer, employing a mold in accordance with one embodiment of the present invention.

Referring to FIG. 6, additional processing is employed to form a multi-layered structure 38 by forming a conformal layer 40 adjacent to patterned imprinting layer 34. One manner in which to form conformal layer 40 is to employ imprint lithography processes, such as those discussed above with respect to depositing patterned imprinting layer 34. To that end, conformal layer 40 may be formed from a polymerizable material similar to that described above with respect to FIGS. 3 and 4, excepting that the material from which conformal layer 40 is formed includes silicon, i.e., is a silicon-containing polymerizable material. Conformal layer 40 includes first and second opposed sides. First side 40b faces patterned imprinting layer 34 and has a profile complementary to the profile of the patterned imprinting layer 34. The second side faces away from patterned imprinting layer 34 forming normalization surface 40a. Normalization surface 40a is provided with a substantially normalized profile, by ensuring that the distances, $k_2$, $k_4$, $k_6$, $k_8$ and $k_{10}$, between the apex 30c, shown in FIG. 5, of each of the protrusions 30b and normalization surface 40a are substantially the same and that the distance, $k_1$, $k_3$, $k_5$, $k_7$, $k_9$ and $k_{11}$ between a nadir surface 30d of each of the recessions 30a and normalization surface 40a are substantially the same.

One manner in which to provide normalization surface 40a with a normalized profile, a planarizing mold 128 having a planar surface 128a is employed to come into contact with conformal layer 40. As mentioned above, this may be accomplished by moving imprint head 18, shown in FIG. 2, along the Z-axis, moving motion stage 20 along the Z-axis, or both. Thereafter, mold 128 is separated from conformal layer 40 and actinic radiation impinges upon conformal layer 40 to polymerize and, therefore, solidify the same. Alternatively, conformal layer 40 may be applied employing spin-on techniques. Spin-on deposition of conformal layer 40 may be beneficial when recording patterns having numerous features per unit area, i.e., a dense featured pattern.

Figure 7:
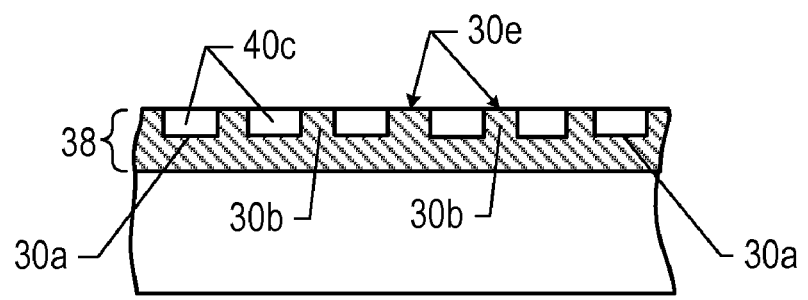
FIG. 7 is a simplified elevation view after a blanket etch of the multi-layered structure, shown in FIG. 6, after formation of a crown surface in the conformal layer with portions of the patterned imprinting layer being exposed in accordance with one embodiment of the present invention.

Referring to FIGS. 6 and 7, a blanket etch is employed to remove portions of conformal layer 40 to provide multi-layered structure 38 with a crown surface 38a. Crown surface 38a is defined by an exposed surface 30e of each of protrusions 30b and upper surfaces of portions 40c that remain on conformal layer 40 after the blanket etch.

Figure 8:
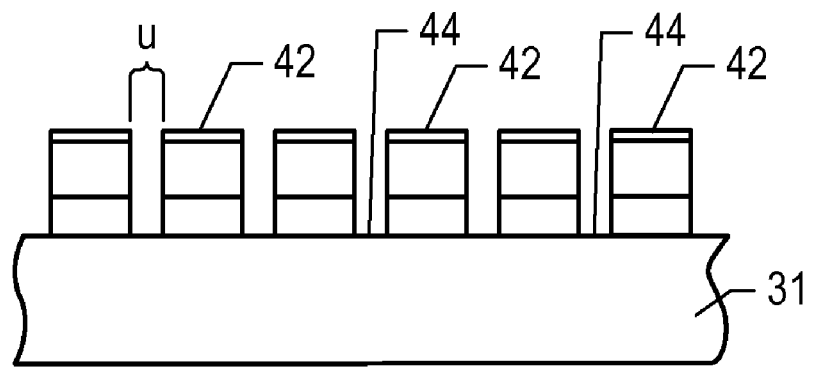
FIG. 8 is a simplified elevation view of the multi-layered structure, shown in FIG. 7, after subjecting the crown surface to an anisotropic etch to expose regions of a substrate in accordance with the present invention.

Referring to FIGS. 7 and 8, crown surface 38a is subjected to an anisotropic etch. The etch chemistry of the anisotropic etch is selected to maximize etching of protrusions 30b and the segments of patterned imprinting layer 34, shown in FIG. 6, in superimposition therewith, while minimizing etching of the portions 40c in superimposition with recessions 30a. In the present example, advantage was taken of the distinction of the silicon content between the patterned imprinting layer 34 and the conformal layer 40. Specifically, employing a plasma etch with an oxygen-based chemistry, it was determined that an in-situ hardened mask 42 would be created in the regions of portions 40c proximate to surface 38a. This results from the interaction of the silicon-containing polymerizable material with the oxygen plasma. As a result of the hardened mask 42 and the anisotropicity of the etch process, regions 44 of wafer 31 in superimposition with protrusions 30b are exposed. The width U' of regions 44 is optimally equal to width $W_2$, shown in FIG. 2.

Referring to FIGS. 2, 7 and 8, the advantages of this process are manifold. For example, the relative etch rate between portions 40c and exposed surfaces 30e may be in a range of about 1.5:1 to about 100:1 due to the presence of the hardened mask 42. As a result, the dimensional width U' of regions 44 may be precisely controlled, thereby reducing transfer distortions of the pattern into wafer 31.

Figure 11:
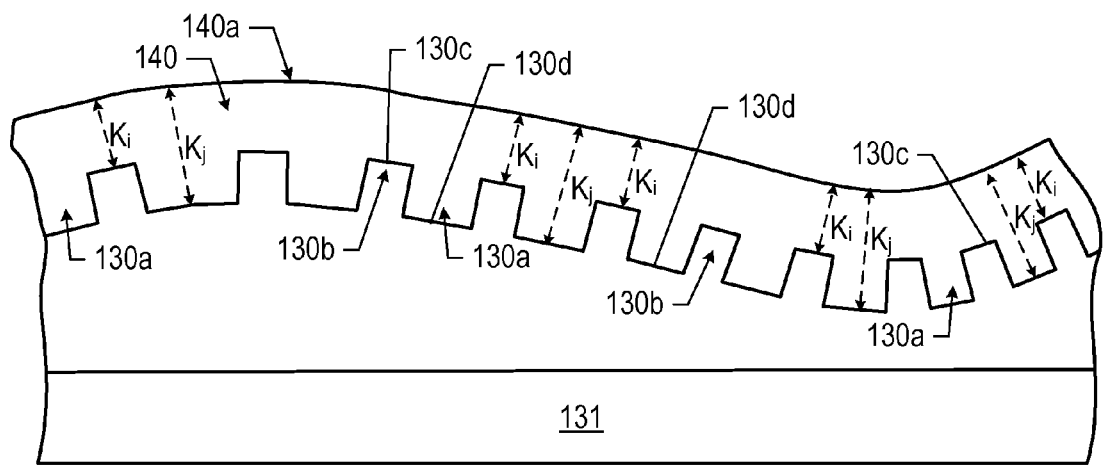
FIG. 11 is a simplified elevation view of a multi-layered structure after deposition of a conformal layer in accordance with an alternate embodiment of the present invention.

Referring to FIGS. 1, 5 and 11 additionally, the control of dimensional width U' becomes relatively independent of residual thickness $t_2$. The rate at which the polymerizable fluid fills the pattern on mold 28 is inversely proportional to the cube of residual thickness $t_2$. As a result, residual thickness $t_2$ may be selected to maximize throughput without substantially increasing transfer distortions. Decoupling of the transfer distortions from residual thickness $t_2$ facilitates patterning non-planar surfaces without exacerbating transfer distortions. This is particularly useful when mold 28 is deformed due to external forces, such as typically occurs when varying the dimensions of mold 28 when effectuating magnification correction. As a result, deformation in mold patterned imprinting layer 34 may have a profile in which apex 130c of protrusions 130b are not coplanar and/or nadir surface 130d of recessions 130a are not coplanar.

To attenuate the transfer distortions that may result from this profile, conformal layer 140 is deposited so that distances, $k_i$, between the apex 130c of each of the protrusions 130b and normalization surface 140a satisfies the following parameter:

$$|k_{i_{min}} - k_{i_{max}}| \langle t_3$$

where $k_{i_{min}}$ is smallest value for $k_i$ and $k_{i_{max}}$ is the greatest value for $k_i$ and $t_3$ is the height of protrusion 130b measured between apex 130c and nadir surface 130d. Thus, the constraint on the normalization provided by normalization surface 140a may be relaxed so as not to require each value of $k_i$ to be substantially identical. To that end, conformal layer 140 may be applied by either spin-coating techniques or imprint lithography techniques. Thereafter, stage 20 is employed to move substrate 131 along the Z-axis to compress conformal layer 140 against a planar surface, such as mold 28. Alternatively, mold 28 may be moved against normalization surface 140a or both.

Finally, forming patterned imprinting layer 34 from a substantially silicon-free polymerizable fluid eases the cleaning process of mold 28, especially considering that mold 28 is often formed from fused silica.

Referring to both FIGS. 1 and 2, an exemplary radiation source 22 may produce ultraviolet radiation. Other radiation sources may be employed, such as thermal, electromagnetic and the like. The selection of radiation employed to initiate the polymerization of the material in patterned imprinting layer 34 is known to one skilled in the art and typically depends on the specific application which is desired. Furthermore, the plurality of features on patterned mold 28 are shown as recesses 28a extending along a direction parallel to projections 28b that provide a cross-section of patterned mold 28 with a shape of a battlement. However, recesses 28a and projections 28b may correspond to virtually any feature required to create an integrated circuit and may be as small as a few tenths of nanometers.

It may be desired to manufacture components of system 10 from materials that are thermally stable, e.g., have a thermal expansion coefficient of less than about 10 ppm/degree Centigrade at about room temperature (e.g. 25 degrees Centigrade). In some embodiments, the material of construction may have a thermal expansion coefficient of less than about 10 ppm/degree Centigrade, or less than 1 ppm/degree Centigrade. To that end, bridge supports 12, bridge 14, and/or stage support 16 may be fabricated from one or more of the following materials: silicon carbide, iron alloys available under the trade-name INVAR®, or trade-name SUPER INVAR™, ceramics, including but not limited to ZERODUR® ceramic. Additionally, table 24 may be constructed to isolate the remaining components of system 10 from vibrations in the surrounding environment. An exemplary table 24 is available from Newport Corporation of Irvine, Calif.

Referring to FIGS. 1, 2 and 5, the pattern produced by the present patterning technique may be transferred into wafer 31 provided features have aspect ratios as great as 30:1. To that end, one embodiment of patterned mold 28 has recesses 28a defining an aspect ratio in a range of 1:1 to 10:1. Specifically, projections 28b have a width $W_1$ in a range of about 10 nm to about 5000 µm, and recesses 28a have a width $W_2$ in a range of 10 nm to about 5000 µm. As a result, patterned mold 28 and/or substrate 26, may be formed from various conventional materials, such as, but not limited to, fused-silica, quartz, silicon, organic polymers, siloxane polymers, borosilicate glass, fluorocarbon polymers, metal, and combinations of the above.

Referring to FIGS. 1, 2 and 3, the characteristics of material 36a are important to efficiently pattern wafer 31 in light of the unique deposition process employed. As mentioned above, material 36a is deposited on wafer 31 as a plurality of discrete and spaced-apart beads 36. The combined volume of beads 36 is such that the material 36a is distributed appropriately over area of surface 32 where patterned imprinting layer 34 is to be formed. As a result, patterned imprinting layer 34 is spread and patterned concurrently, with the pattern being subsequently set by exposure to radiation, such as ultraviolet radiation. As a result of the deposition process it is desired that material 36a have certain characteristics to facilitate rapid and even spreading of material 36a in beads 36 over surface 32 so that all thicknesses $t_1$ are substantially uniform and all residual thicknesses $t_2$ are substantially uniform.

Figure 9:
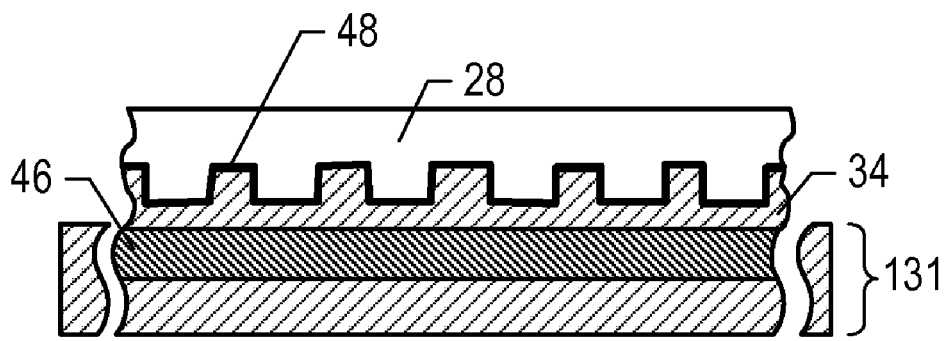
FIG. 9 is a simplified elevation view of material in an imprint device and substrate employed with the present invention in accordance with an alternate embodiment of the present invention.

Referring to FIGS. 2 and 9, employing the compositions described above in material 36a, shown in FIG. 3, to facilitate imprint lithography is achieved by including, on substrate 131, a primer layer 46. Primer layer 46 functions, inter alia, to provide a standard interface with patterned imprinting layer 34, thereby reducing the need to customize each process to the material from which substrate 131 is formed. In addition, primer layer 46 may be formed from an organic material with the same etch characteristics as patterned imprinting layer 34. Primer layer 46 is fabricated in such a manner so as to possess a continuous, smooth, relatively defect-free surface that may exhibit excellent adhesion to patterned imprinting layer 34.

Figure 10:
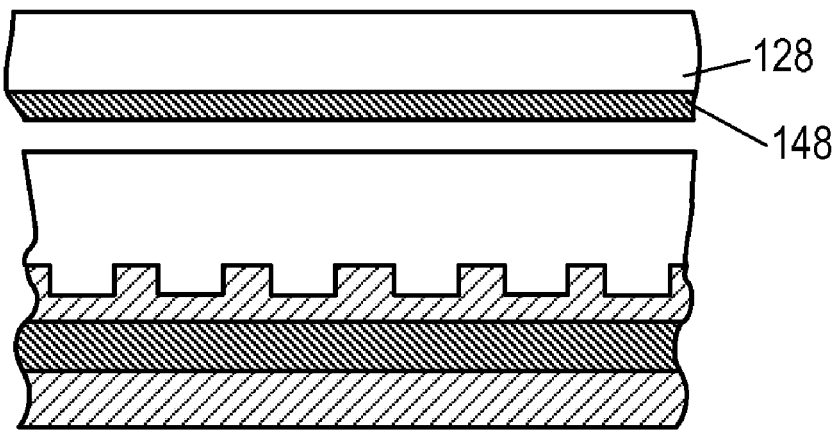
FIG. 10 is a simplified elevation view of a lithographic system, shown in FIG. 1, after formation of a multi-layered structure by deposition of a conformal layer, adjacent to the patterned imprinting layer, employing a planarized mold in accordance with an alternate embodiment of the present invention.

Additionally, to ensure that patterned imprinting layer 34 does not adhere to patterned mold 28, surface 28c, shown in FIG. 5, may be treated with a low surface energy coating 48. As a result, patterned imprinting layer 34 is located between primer layer 46 and coating 48 upon contact of mold 28 with substrate 131. Coating 48 may be applied using any known process. For example, processing techniques may include chemical vapor deposition method, physical vapor deposition, atomic layer deposition or various other techniques, brazing and the like. In a similar fashion a low surface energy coating 148 may be applied to planarizing mold 128, shown in FIG. 10. Alternatively, release properties of either patterned imprinting layer 34 or conformal layer 140, shown in FIG. 11, may be improved by including, in the material from which the same is fabricated, a compound having low surface energy, referred to as a surfactant. The compound is caused to migrate to a surface of the layer formed therewith to interface with mold 28 using known techniques. Typically, the surfactant has a surface energy associated therewith that is lower than a surface energy of the polymerizable material in the layer. An exemplary material and process by which to form the aforementioned surfactant is discussed by Bender et al. in *Multiple Imprinting In UV-Based Nanoimprint Lithography: Related Material Issues*, Microelectronic Engineering pp. 61-62 (2002). The low surface energy of the surfactant provides the desired release properties to reduce adherence of either imprinting layer 34 or conformal layer 40 to mold 28. It should be understood that the surfactant may be used in conjunction with, or in lieu of, low surface energy coatings 48 and 148.

The embodiments of the present invention described above are exemplary. Many changes and modifications may be made to the disclosure recited above, while remaining within the scope of the invention. The scope of the invention should, therefore, be determined not with reference to the above description, but instead should be determined with reference to the appended claims along with their full scope of equivalents.

What is claimed is:

1. A method of patterning a substrate, the method comprising:
   forming a patterned layer on a substrate, the patterned layer having protrusions and recessions;
   dispensing polymerizable material on the patterned layer, defining a conformal layer, the patterned layer and the conformal layer collectively defining a multi-layered structure, the multi-layered structure having a crown surface facing away from the substrate; and,
   selectively removing portions of the multi-layered structure to expose regions of the substrate in superimposition with the protrusions while forming a hard mask in areas of the crown surface in superimposition with the recessions.

2. The method as recited in claim 1, wherein forming the patterned layer further includes providing the protrusions with an apex and a height.

3. The method as recited in claim 2, wherein defining the conformal layer further includes providing the conformal layer with a normalization surface spaced-apart from one apex a minimum distance and spaced-apart from an additional apex a maximum distance with the height being greater than a difference between the maximum distance and the minimum distance.

4. The method as recited in claim 1, wherein the conformal layer is defined using silicon-containing polymerizable material.

5. The method as recited in claim 1, wherein the conformal layer is defined by dispensing, on the substrate, a polymerizable fluid composition and contacting the polymerizable fluid composition with a mold having a substantially planar surface and subjecting the polymerizable fluid composition to conditions to polymerize the polymerizable fluid composition.

6. The method as recited in claim 1, further including depositing a primer layer between the patterned layer and the substrate.

7. The method as recited in claim 1, wherein the conformal layer is defined with a section having a normalization surface disposed opposite to the patterned layer and spaced-apart from the protrusions.

8. The method as recited in claim 7, further including removing portions of the section to expose the protrusions, defining the crown surface and exposing the crown surface to an etch chemistry.

9. A method of patterning a substrate, the method comprising:
   creating a multi-layered structure with e-beam lithography by forming, on the substrate, a patterned layer having protrusions and recessions, by dispensing, on the substrate, droplets of polymerizable fluid composition and contacting the polymerizable fluid composition with a surface of a mold, and subjecting the polymerizable fluid composition to conditions to polymerize the polymerizable fluid composition, forming the patterned layer, and forming, upon the patterned layer, a conformal layer, with the multi-layered structure having a crown surface facing away from the substrate; and
   selectively removing portions of the multi-layered structure to expose regions of the substrate in superimposition with the protrusions while forming a hard mask in areas of the crown surface in superimposition with the recessions.

10. The method as recited in claim 9, wherein forming the patterned layer further includes providing the protrusions with an apex and a height.

11. The method as recited in claim 10, wherein forming the conformal layer further includes providing the conformal layer with a normalization surface spaced-apart from one apex a minimum distance and spaced-apart from an additional apex a maximum distance with the height being greater than a difference between the maximum distance and the minimum distance.

12. The method as recited in claim 9, wherein creating further includes forming the conformal layer from a silicon-containing polymerizable material.

13. The method as recited in claim 9, further including depositing a primer layer between the patterned layer and the substrate.

14. The method as recited in claim 9, wherein creating further includes forming the conformal layer with a section having a normalization surface disposed opposite to the patterned layer and spaced-apart from the protrusions.

15. The method as recited in claim 14, further including removing portions of the section to expose the protrusions, defining the crown surface and exposing the crown surface to an etch chemistry.

16. The method as recited in claim 15, wherein removing portions further includes subjecting the normalization surface to a blanket etch and exposing the crown surface further includes subjecting the crown surface to an anisotropic plasma etch.

* * * * *